(12) United States Patent
Huang et al.

(10) Patent No.: US 9,171,731 B2
(45) Date of Patent: Oct. 27, 2015

(54) METHOD OF FORMING THE GATE WITH THE LELE DOUBLE PATTERN

(71) Applicant: Shanghai Huali Microelectronics Corporation, Shanghai (CN)

(72) Inventors: Jun Huang, Shanghai (CN); ZhiBiao Mao, Shanghai (CN); QuanBo Li, Shanghai (CN); ZhiFeng Gan, Shanghai (CN); RunLing Li, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 53 days.

(21) Appl. No.: 14/085,380

(22) Filed: Nov. 20, 2013

(65) Prior Publication Data

US 2015/0050801 A1    Feb. 19, 2015

(30) Foreign Application Priority Data

Aug. 16, 2013    (CN) .......................... 2013 1 0360404

(51) Int. Cl.
| | | |
|---|---|---|
| H01L 21/302 | (2006.01) | |
| H01L 21/306 | (2006.01) | |
| H01L 21/28 | (2006.01) | |
| H01L 21/033 | (2006.01) | |
| H01L 21/3213 | (2006.01) | |
| H01L 21/308 | (2006.01) | |

(52) U.S. Cl.
CPC .......... *H01L 21/306* (2013.01); *H01L 21/0337* (2013.01); *H01L 21/28123* (2013.01); *H01L 21/32139* (2013.01); *H01L 21/3081* (2013.01); *H01L 21/3086* (2013.01)

(58) Field of Classification Search
CPC ............ H01L 21/3081; H01L 21/3086; H01L 21/306; H01L 21/28123; H01L 21/0337; H01L 21/32139
USPC ............ 438/717, 736; 257/E21.035, E21.232
See application file for complete search history.

(56) References Cited

U.S. PATENT DOCUMENTS

| | | | |
|---|---|---|---|
| 6,268,281 B1 * | 7/2001 | Shih et al. ...................... 438/629 |
| 2009/0170033 A1 * | 7/2009 | Jung et al. ...................... 430/313 |
| 2010/0248491 A1 * | 9/2010 | Sun et al. ...................... 438/717 |
| 2011/0062502 A1 * | 3/2011 | Yin et al. ....................... 257/288 |

FOREIGN PATENT DOCUMENTS

| | | |
|---|---|---|
| CN | 101303525 A | 6/2008 |
| CN | 101446760 A | 10/2008 |

* cited by examiner

*Primary Examiner* — Kimberly Rizkallah
*Assistant Examiner* — Maria Ligai
(74) *Attorney, Agent, or Firm* — Myron Greenspan; Lackenbach Siegel LLP

(57) ABSTRACT

The invention relates to microelectronic technology and, more specifically, relates to a method of forming a gate with a LELE double pattern. The method adopts an ONO structure (Oxide-SiN-Oxide). The ONO structure is exposed twice, and the advanced patterning film is used as a mask in the processing of polysilicon etching. The ONO structure is used to replace the traditional hardmask of silicon oxide, and the substructure of ODL (Organic Under Layer) which is based on the spin-on, and the middle layer structure of SHB (Si-based hardmask). The method saves cost and improves the process of advanced patterning film as a mask with the nodes in 40 nm and above which is applied to the process with the nodes in 22/20 nm and below. Consequently, the maturity and stability of the process for poly gate with the nodes in 22/20 nm and below are improved.

7 Claims, 4 Drawing Sheets

METHOD OF FORMING THE GATE WITH THE LELE DOUBLE PATTERN

CROSS-REFERENCE TO RELATED APPLICATIONS

The present application claims priority under the Paris Convention to Chinese application number CN 201310360404.7, filed on Aug. 16, 2013, the disclosure of which is herewith incorporated by reference in its entirety.

BACKGROUND OF THE INVENTION

1. Field of the Invention

The present invention relates to the microelectronic technology, more specifically, relates to a method of forming the gate with a LELE double pattern.

2. Description of the Prior Art

In the technology node of 32 nm and below of the photo-etching process, the resolution index requirement thereof exceeds the limit of the optical lithography platform. A series of measures were adopted to solve the problem. As the ITRS (International Technology Roadmap for Semiconductors) shows, the DPT (double patterning technology), the EUV (extreme ultraviolet) and the EBL (electron beam lithography) are highly expected.

DPT splits a set of high-integrated circuit patterns into two and more low-integrated circuit patterns. The mask is manufactured respectively, and is completed exposing and etching in order, and then is merged into the high-integrated circuit pattern desired.

With the development of technology of the software and hardware of the photoetching equipment, the resolution and technical life of 193 nm immersion optical lithography platform are extended accordingly. The photoetching technologies of the immersion photoetching machine, of the EUV and even the smaller technology node are developed.

According to the research, the process of LELE (Litho-Etch-Litho-Etch) is the most popular process of DPT. This process forms the desired pattern by twice lithography and etching. There are two types for the desired pattern: the line and the trench.

FIG. 1a is a diagram of the traditional DPT with the first photolithography process. FIG. 1b is a diagram of the traditional DPT with the second photolithography process. FIG. 1c is a diagram of the traditional DPT with the process of LELE. As shown in FIGS. 1a-1c, the resolution of 193 nm immersion machine, such as NXT-1950i, has the HP (half pitch) of 38 nm, in order to satisfy the active layer of nodes in 22/20 nm and the design for poly gate. As shown in FIG. 1a, the Exposure 1 is formed by the first photolithography process. And as shown in FIG. 1b, the Exposure 2 is formed by the second photolithography process. Then the final contour is formed by the Exposure 1 and Exposure 2 with the process of LELE.

In the traditional processing for poly gate in 22/20 nm node, the main method is lithography and etching the polysilicon just by once, and the ODL (organic under layer) with spin-on is used to fill the patterns under layer. The SHB (Si-based hardmask) is used as a hardmask for the second photolithography. Finally, the bottom anti-reflective layer and the photo resist are formed a structure before the second exposing, that means the silicon oxide is used as a hardmask in the process of etching the polycrystalline silicon.

As the ODL and SHB are new materials and their cost is high, it is not often used for the process of the nodes in 40 nm and above. If these new materials are used in the process of the nodes in 28 nm and below, that will cost a lot of time and money.

Chinese Patent (CN 101303525A) has disclosed a method of double patterning. The method uses a filling material which is soluble in the developing solution to fill the trench with repeated layers and baking. Then the remnant fillers are removed by the repeated processes of developing. In another words, the flatness of silicon wafer is improved by the processing of double patterning with the developed filler. It also reduced the adverse effects of the trench filling to the accuracy of lithographic and the focal depth of subsequent lithography.

Chinese Patent (CN 101446760A) disclosed a method of double patterning for lithography, and the process comprises the following steps: a first photoresist layer is formed on the substrate at first, and the first photoresist layer has at least one opening, then the first photoresist layer is solidified. A second photoresist layer is formed on the substrate, then the first photoresist layer and the second photoresist layer are removed to expose the substrate, and making a smaller interval between the first photoresist pattern and the second photoresist pattern.

SUMMARY OF THE INVENTION

Due to the shortcomings of the traditional art, the present invention discloses a method of forming the gate with the LELE double pattern method, wherein the method comprises the following steps:

an advanced patterning film layer and a hardmask layer are deposited on the semiconductor substrate which is provided with a gate layer structure;

the hardmask layer is etched by etching process to form a hardmask structure;

the advanced patterning film is etched by using the hardmask structure as the mask for forming an advanced patterning mask, the etch stops at the upper surface of the gate layer structure;

the gate layer structure is etched by the advanced patterning mask for forming gate structures, the etch stops at the upper surface of the semiconductor substrate.

According to the above method, wherein the gate structure comprises a gate oxide layer, a polysilicon layer and a first silicon nitride layer;

the gate oxide layer covers the upper surface of the semiconductor substrate, the polysilicon layer covers the upper surface of the gate oxide layer, the first silicon nitride layer covers the upper surface of the polysilicon, the advanced patterning layer covers the upper surface of the first silicon nitride layer.

According to the above method, wherein the thickness of the polysilicon layer ranges from 500 Å to 700 Å.

According to the above method, wherein the thickness of the first silicon nitride ranges from 300 Å to 400 Å.

According to the above method, wherein the hardmask layer comprises a first dielectric anti-reflectivity layer, a second silicon nitride layer, and a second dielectric anti-reflectivity layer.

The first dielectric anti-reflectivity layer covers the surface of the advanced patterning film layer, and the second silicon nitride layer covers the surface of the first dielectric anti-reflectivity layer, the second dielectric anti-reflectivity layer covers the surface of the second silicon nitride layer.

According to the above method, wherein the thickness of the first dielectric anti-reflectivity layer ranges from 100 Å to 200 Å.

According to the above method, wherein the thickness of the second silicon nitride layer ranges from 80 Å to 120 Å.

According to the above method, wherein the thickness of the second dielectric anti-reflectivity layer ranges from 80 Å to 120 Å.

According to the above method, wherein the etching process comprises a first photoetch process, a first etching process, a second photoetch process and a second etching process, the hardmask structure comprises a first hardmask structure and a second hardmask structure.

After a first bottom anti-reflectivity layer is formed on the surface of the second dielectric anti-reflectivity layer, a first photoresist is formed on the first bottom anti-reflectivity layer by using the first photoetch process, then die first bottom anti-reflectivity layer, the first dielectric anti-reflectivity layer and the second silicon nitride layer is etched by using the first photoresist as the mask, and the etch stops in the remaining second dielectric anti-reflectivity layer, then the first photoresist and the remaining first bottom anti-reflectivity layer are removed, so that the first hardmask structure is formed in the remaining hardmask layer;

a second bottom anti-reflectivity layer is formed, which covers the remaining hardmask layer, then a second photoresist is formed at the surface of the second bottom anti-reflectivity layer, and then parts of the second bottom anti-reflectivity layer and the remaining hardmask layer are removed by using the second etching process, then the second hardmask structure is formed.

According to the above method, wherein the thickness of the advanced patterning film layer ranges from 800 Å to 1200 Å.

The advantageous effects of the above technical solution are as follows:

a method of LELE double patterning for poly gate, and the method adopted an ONO structure (Oxide-SiN-Oxide), and the ONO structure is based on the advanced patterning film. Then the ONO structure is formed by twice exposing, and the advanced patterning film is used as a mask in the processing of polysilicon etching. Alternatively, the ONO structure is used to replace the traditional hardmask of silicon oxide, and the substructure of ODL which is based on the spin-on, also the middle layer structure of SHB. The method not only saves cost, but also enables the process of advanced patterning film as a mask with the nodes in 40 nm and above to be applied to the process with the nodes in the range of 22/20 nm and below. Consequently, the maturity and stability of the process for poly gate with the nodes in 22/20 nm and below are improved.

DETAILED DESCRIPTION OF THE PREFERRED EMBODIMENT

Figure 1A:
FIG. 1a is a diagram of a structure which is formed after the first photoetch process of the traditional double patterning process.
Figure 1B:
FIG. 1b is a diagram of the structure which is formed after the second photoetch process of the traditional double patterning process.
Figure 1C:
FIG. 1c is a diagram of the structure which is formed after the LELE process of the traditional double patterning process.

The present invention will be further illustrated in combination with the following Figures and embodiments, but these should not be deemed as limitations of the present invention.

Firstly, an advanced patterning film layer and a hardmask layer are deposited in sequence on a semiconductor substrate (the preferred substrate is silicon substrate) which is provided with a gate layer structure, wherein the gate structure comprises a gate oxide, a first polysilicon layer and a silicon nitride layer. The hardmask layer comprises a first dielectric anti-reflectivity layer, a second silicon nitride layer and a second dielectric anti-reflectivity layer. The gate oxide covers the surface of the semiconductor substrate, the polysilicon layer covers the surface of the gate oxide, the first silicon nitride layer covers the surface of the polysilicon layer, the advanced patterning film covers the surface of the first silicon nitride layer, the first dielectric anti-reflectivity layer covers the surface of the advanced patterning film layer, and the second silicon nitride layer covers the surface of the first dielectric anti-reflectivity layer, and the second dielectric anti-reflectivity layer covers the surface of the second silicon nitride layer.

Secondly, parts of the surface of the hardmask layer is etched by the etching process to form a hardmask structure, the etch stops at the surface of the advanced patterning film layer. Specifically, the etching process comprises a first photoetch process, a first etching process, a second photoetch process and a second etching process. The hardmask structure comprises a first hardmask structure and a second hardmask structure. After a first bottom anti-reflectivity layer is formed on the surface of the second dielectric anti-reflectivity layer, a first photoresist is formed on the first bottom anti-reflectivity layer by using the first photoetch process, then the first bottom anti-reflectivity layer, the first dielectric anti-reflectivity layer and the second silicon nitride layer is etched by using the first photoresist as the mask for removing the first photoresist and the remaining first bottom anti-reflectivity layer, so that the first hardmask structure is formed in the remaining hardmask layer, the etch stops in the remaining second dielectric anti-reflectivity layer. A second bottom anti-reflectivity layer is formed, which covers the remaining hardmask layer, then a second photoresist is formed at the surface of the second bottom anti-reflectivity layer, and then parts of the second bottom anti-reflectivity layer and the remaining hardmask layer are removed by using the second etching process, then the second hardmask structure is formed.

Next, parts of the advanced patterning film layer are etched by using the hardmask structure as the mask to form the advanced patterning mask.

Finally, the gate structure is etched by using the advanced patterning mask as the mask to form the gate structure, the etch stops at the surface of the semiconductor substrate.

Embodiment 1

FIGS. 2 to 8 are the structure diagrams of an embodiment of the method in the present invention, as shown in FIG. 2 to FIG. 8, the method of the present invention is preferably applied to the gate forming process whose nodes is 22 nm/20 nm or below proceeded by the 193 nm immersion lithography platform.

Figure 2:
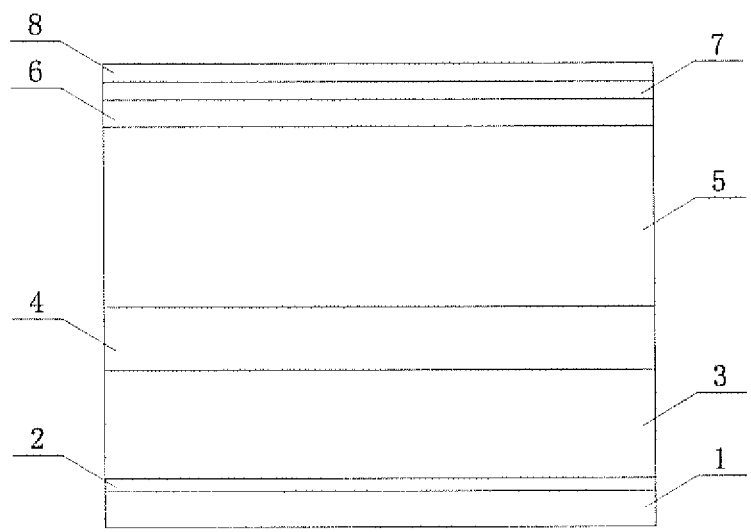
FIGS. 2 to 8 are the structure diagrams of an embodiment of the method in the present invention.

The above method comprises:

Firstly, a gate oxide layer 2, a polysilicon layer 3, a first silicon nitride 4 layer, an advanced patterning film 5, a first dielectric anti-reflectivity coating layer 6, a second silicon nitride 7 layer, and a second dielectric anti-reflectivity coating layer 8 are deposited on a silicon substrate 1, in sequence, to form a structure as shown in FIG. 2. The gate oxide layer 2, polysilicon layer 3 and first silicon nitride layer 4 make up a gate layer structure, which will be used for forming the gate structure. The first dielectric anti-reflectivity coating layer 6, second silicon nitride layer 7, and second dielectric anti-reflectivity coating layer 8 make up a hardmask layer, which will be used as the mask in the follow-up etching process.

Preferably, the thickness of polysilicon layer 3 ranges from 500 Å to 700 Å, such as 500 Å, 550 Å, 600 Å, 650 Å or 700 Å and so on. The thickness of first silicon nitride layer 4 ranges from 300 Å to 400 Å, such as 300 Å, 325 Å, 350 Å, 375 Å or 400 Å and so on. The thickness of advanced patterning film 5 ranges from 800 Å to 1200 Å, such as 800 Å, 900 Å, 1000 Å, 1100 Å or 1200 Å and so on. The thickness of first dielectric anti-reflectivity coating layer 6 ranges from 100 Å to 200 Å, such as 100 Å, 125 Å, 150 Å, 175 Å or 200 Å and so on. The thickness of second silicon nitride layer 7 ranges from 80 Å to 120 Å, such as 80 Å, 90 Å, 100 Å, 110 Å or 120 Å and so on. The thickness of second dielectric anti-reflectivity coating layer 8 ranges from 80 Å to 120 Å, such as 80 Å, 95 Å, 105 Å, 115 Å or 120 Å and so on.

Preferably, the thickness of the above mentioned hardmask layer, which is the ONO structure, ranges from 300 Å to 350 Å, such as 300 Å, 315 Å, 325 Å, 340 Å or 350 Å and so on.

Furthermore, if the thickness of the polysilicon 3 layer is 600 Å, the preferred thickness of first silicon nitride layer 4 is 350 Å, the preferred thickness of advanced patterning film 5 will be 1000 Å, the preferred thickness of first dielectric anti-reflectivity coating layer 6 is 150 Å, the preferred thickness of the second silicon nitride layer 7 is 100 Å, and the preferred thickness of second dielectric anti-reflectivity coating layer 8 is 100 Å.

Secondly, referring to FIG. 9, the anti-reflective material is covered on the surface of second dielectric anti-reflectivity coating layer 8, then the anti-reflective material is cured. Consequently, the first bottom anti-reflectivity coating layer 9 is formed, which covers the surface of the second dielectric anti-reflectivity coating layer 8, then the follow-up etching process is continued.

Figure 3:
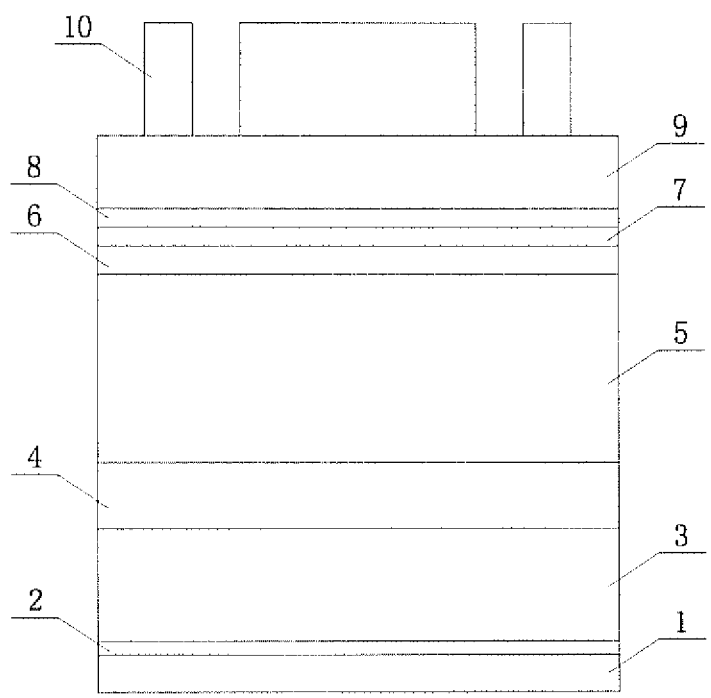
Figure 4:
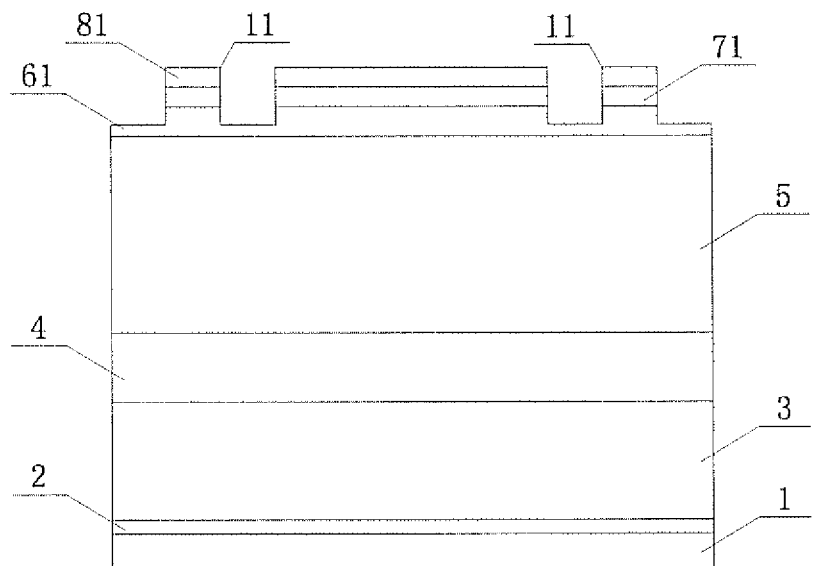

Specifically, the above mentioned etching process comprises a first photoetch process, a first etching process, a second photoetch process and a second etching process. The photoresist is coated on the surface of the first bottom anti-reflectivity coating layer 9, after being exposed and developed, the needless parts of the photoresist is removed, a first photoresist 10 having the pattern of the first hardmask structure is formed, the structure as shown in FIG. 3. Then the first bottom anti-reflectivity coating layer 9, second dielectric anti-reflectivity coating layer 8 and second silicon nitride layer 7 are etched by using first photoresist 10 as the mask for removing first photoresist 10 and the remaining first bottom anti-reflectivity coating layer. Consequently a first hardmask structure 11 is formed in the remaining hardmask layer, which is the structure made up of the remaining second dielectric anti-reflectivity coating layer 81, the remaining second silicon nitride layer 71 and the remaining first dielectric anti-reflectivity coating layer 61, so the first hardmask structure 11 will be used as the mask for opening the advanced patterning film layer 5 in the follow-up etching process which forms the end of the lines, that is the structure as shown in FIG. 4.

Figure 5:
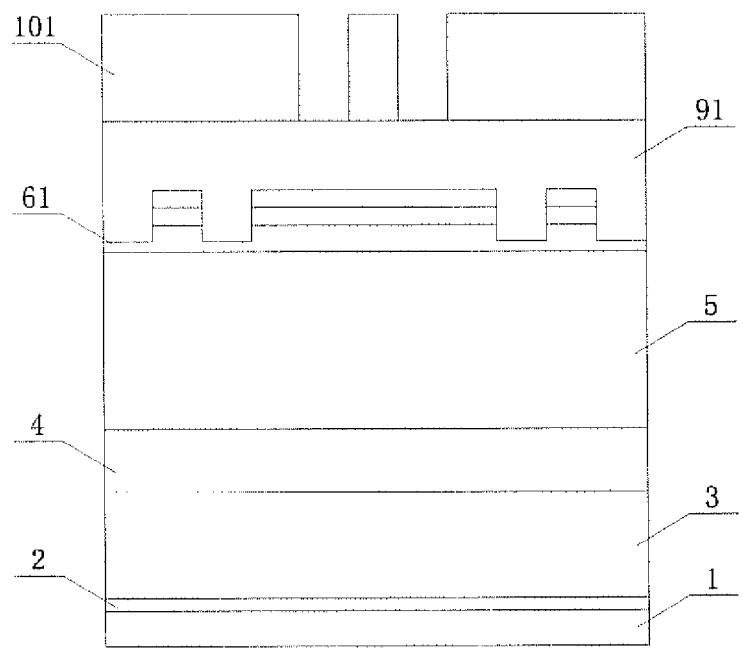
Figure 6:
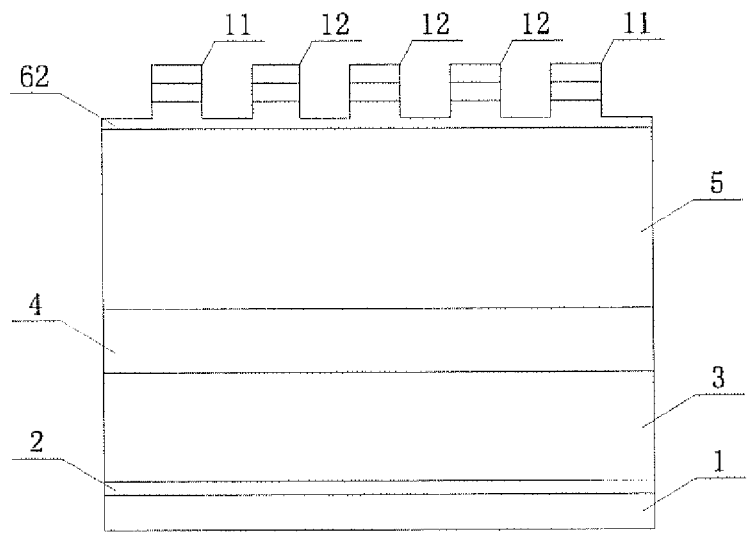

As shown in FIG. 5, the anti-reflective material is coated and cured to form a second bottom anti-reflectivity coating layer 91 which is filled up and covers the remaining second hardmask layer, then the photoresist is coated, exposed and developed in sequence. Consequently, the needless parts of the photoresist can be removed, second photoresist 101 having the pattern of the second hardmask structure is formed, that is the structure as shown in FIG. 5. Then the second bottom anti-reflectivity coating layer 91, the remaining second dielectric anti-reflectivity coating layer 81, the remaining second silicon nitride layer 71 and the remaining first dielectric anti-reflectivity coating layer 61 are etched in sequence by using second photoresist 101, where the etched areas do not overlap with the etched areas of the first hardmask structure 11. Therefore, the etched areas of the first etching process do not overlap with the etched areas of the second etching process, as the mask for removing second photoresist 101 and the remaining second bottom anti-reflectivity coating layer, so that second hardmask structure 12 is formed, which is shown in FIG. 6.

Preferably, the remaining first dielectric anti-reflectivity coating layer 62 still covers the surface of advanced patterning film layer 5, that is the thickness of the region which is located out of the hardmask structure is thinned, so that there is no damage caused by the etching of the first etching process and the second etching process in the advanced patterning film layer 5. The etch of the first etching process and the second etching process stops at the interface of the second silicon nitride layer and the first dielectric anti-reflectivity coating layer. Due to the over etching, the first dielectric anti-reflectivity coating layer will be thinned, i.e., the first dielectric anti-reflectivity coating layer can protect the advanced patterning film layer during the first etching process and the second etching process. The second dielectric anti-reflectivity coating layer can reduce the reflectivity of the photoetch. For example, CF4 is used as the main etching gas in the first etching process and the second etching process to etch the second dielectric anti-reflectivity coating layer. In the process of etching the second dielectric anti-reflectivity coating, and then the CH3F is used as the main etching gas to etch the second silicon nitride Layer 7 at a high selection ratio of silicon nitride against the oxide. The etching of the first etching process and the second etching process stops at the first dielectric anti-reflectivity coating layer by seizing the endpoint. The depth of the over etching is not more than 5 nm. Thus, the uniformity of the first etching process and the second etching process is controlled in the range within 5%, and the damage to the advanced patterning film 5 caused by the etching process is avoided.

Figure 7:
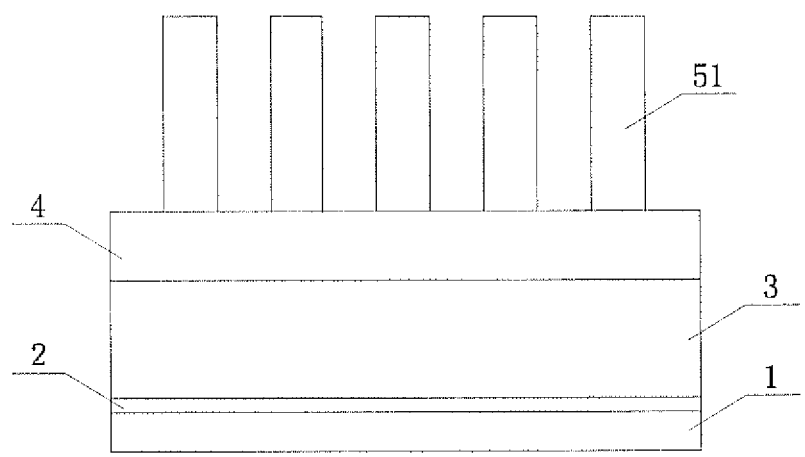
Figure 8:
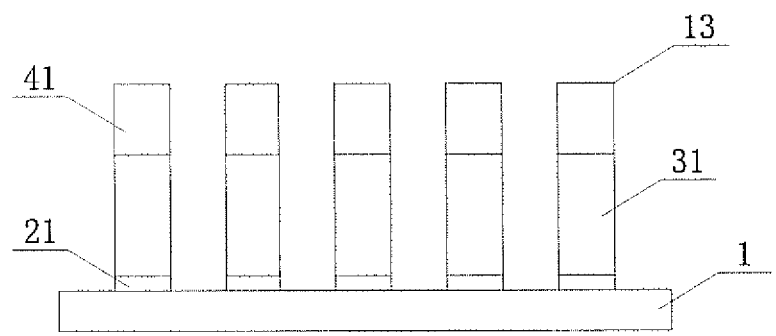

As shown in FIG. 7, the advanced patterning film is etched by using the hardmask structure as the mask, which is made up to the first hardmask structure 11 and the second hardmask structure 12. If the remaining first dielectric anti-reflectivity coating layer 62 covers the surface of advance patterning film 5, the remaining first dielectric anti-reflectivity coating layer 62 needs to be etched again. Then, the above mentioned hardmask structure is removed, so that advanced patterning mask 51 is located on the surface of the first silicon nitride layer 4 is formed, which is shown in FIG. 7. Then, the LELE double patterning process is completed. Finally, the first silicon nitride layer 4, polysilicon layer 3 and gate oxide layer 2 is etched by using advanced patterning mask 51 as the mask. Next, advanced patterning mask 51 is removed, so that the gate structure is formed, which is made up to the remaining first silicon oxide layer 41, the remaining polysilicon layer 31 and the remaining gate oxide layer 21.

The preferred thicknesses of the first bottom anti-reflectivity coating layer 9 and second bottom anti-reflectivity coating layer 91 are all ranges from 250 Å to 350 Å, such as 250 Å, 275 Å, 300 Å, 325 Å, 350 Å and so on.

In addition, the wave length of the exposing light of the photoresist which is used in the first etching process and the second etching process is 193 nm, the photoresist which is used in the first etching process and the second etching process is the ArF photoresist whose wave length of the expose light is 193 nm, and the thickness of the photoresist is controlled in a range of 800 Å to 1000 Å, such as 800 Å, 900 Å or 1000 Å and so on.

The above method is applied to the technology platforms of logic, memory, RF, HV and flash, also applicable to the other processes with the nodes in 22/20 nm and below.

The double patterning poly process is applied to the processes with the nodes in 22/20 nm and below, which has solved the problem of lacking of resolution in the photoetch by the twice expose process. The process of LELE double patterning is applied to the process with the nodes in 22 nm and below. In the present invention, there is an overlapping part in the two etching process. Therefore, the thickness of the dielectric anti-reflectivity coating layer or ONO structure is thicker than the traditional structures.

In conclusion, the present invention provides a method of forming the gate with the LELE double pattern, and the method adopted an ONO (Oxide-SiN-Oxide, refers to a hardmask structure), and the ONO is based on the advanced patterning film. Then the ONO is formed with twice exposing, and the advanced patterning film is used as a mask in the processing of polysilicon etching. In another word, the ONO is used to replace the traditional hardmask of silicon oxide, and the substructure of ODL which is based on the spin-on, also the middle layer structure of SHB. The method not only saves the cost, but also makes the process of advanced patterning film as a mask with the nodes in 40 nm and above can be applied to the process with the nodes in 22/20 nm and below. The maturity and stability of the process for poly gate with the nodes in 22/20 nm and below are improved. The process of LELE is optimized, and the performance and the yield of products are also improved.

Although a typical embodiment of a particular structure of the specific implementation has been disclosed in the above description and the figures, it is appreciated that other changes based on the spirit of this invention may also be made. Though the preferred embodiments are proposed above, these contents will never be the limitation of this invention. It is obvious for the skilled in the art to make varieties of changes and modifications after reading the above descriptions. Hence, the claims attached should be regarded as all the changes and modifications which cover the real intention and the range of this invention. Any and all equivalent contents and ranges in the range of the claims are intended to come within the range or scope of this invention.

The invention claimed is:

1. A method of forming the gate with a Litho-Etch-Litho-Etch (LELE) double pattern, wherein said method comprises the following steps:
   depositing an advanced patterning film layer and a hard mask layer on a semiconductor substrate which is provided with a gate layer structure;
   etching the hard mask layer by an etching process to form a hard mask structure;
   etching the advanced patterning film layer by using the hard mask structure as a mask for forming an advanced patterning mask and stopping etching of the advanced patterning film layer at the upper surface of the gate layer structure; and
   etching the gate layer structure by the advanced patterning mask for forming gate structures and stopping the etching of the gate layer structure at the upper surface of the semiconductor substrate;
   wherein the gate structure comprises a gate oxide layer, a polysilicon layer and a first silicon nitride layer;
   the gate oxide layer covers the upper surface of the semiconductor substrate, the polysilicon layer covers the upper surface of the gate oxide layer, the first silicon nitride layer covers the upper surface of the polysilicon, the advanced patterning layer covers the upper surface of the first silicon nitride layer;
   the hard mask layer comprises a first dielectric anti-reflectivity layer, a second silicon nitride layer, and a second dielectric anti-reflectivity layer;
   the first dielectric anti-reflectivity layer covers the surface of the advanced patterning film layer, and the second silicon nitride layer covers the surface of the first dielectric anti-reflectivity layer, the second dielectric anti-reflectivity layer covers the surface of the second silicon nitride layer;
   wherein the etching process comprises a first photoetch process, a first etching process, a second photoetch process and a second etching process, the hard mask structure comprises a first hard mask structure and a second hard mask structure;
   after a first bottom anti-reflectivity layer is formed on the surface of the second dielectric anti-reflectivity layer, a first photoresist is formed on the first bottom anti-reflectivity layer by using the first photoetch process, then the first bottom anti-reflectivity layer, the first dielectric anti-reflectivity layer and the second silicon nitride layer is etched by using the first photoresist as the mask, and the etch stops in the remaining second dielectric anti-reflectivity layer, then the first photoresist and the remaining first bottom anti-reflectivity layer are removed, so that the first hard mask structure is formed in the remaining hard mask layer;
   a second bottom anti-reflectivity layer is formed, which covers the remaining hard mask layer, then a second photoresist is formed at the surface of the second bottom anti-reflectivity layer, and then parts of the second bottom anti-reflectivity layer and the remaining hard mask layer are removed by using the second etching process, then the second hard mask structure is formed.

2. The method according to claim 1, wherein the thickness of the polysilicon layer ranges from 500 Å to 700 Å.

3. The method according to claim 1, wherein the thickness of the first silicon nitride ranges from 300 Å to 400 Å.

4. The method according to claim 1, wherein the thickness of the first dielectric anti-reflectivity layer ranges from 100 Å to 200 Å.

5. The method according to claim 1, wherein the thickness of the second silicon nitride layer ranges from 80 Å to 120 Å.

6. The method according to claim 1, wherein the thickness of the second dielectric anti-reflectivity layer ranges from 80 Å to 120 Å.

7. The method according to claim 1, wherein the thickness of the advanced patterning film layer ranges from 800 Å to 1200 Å.

* * * * *